United States Patent
Oi et al.

(10) Patent No.: US 7,521,515 B2
(45) Date of Patent: Apr. 21, 2009

(54) FILLER LAYER FOR SOLAR CELL MODULE AND SOLAR CELL MODULE USING SAME

(75) Inventors: Kasumi Oi, Tokyo-to (JP); Hiroki Nakagawa, Tokyo-to (JP); Takaki Miyachi, Tokyo-to (JP); Isao Inoue, Tokyo-to (JP); Koujiro Ohkawa, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 324 days.

(21) Appl. No.: 10/559,581

(22) PCT Filed: Jun. 2, 2004

(86) PCT No.: PCT/JP2004/008009

§ 371 (c)(1),
(2), (4) Date: Dec. 2, 2005

(87) PCT Pub. No.: WO2004/109811

PCT Pub. Date: Dec. 16, 2004

(65) Prior Publication Data

US 2006/0142490 A1 Jun. 29, 2006

(30) Foreign Application Priority Data

Jun. 3, 2003 (JP) .............................. 2003-158267

(51) Int. Cl.
*C08F 30/08* (2006.01)
(52) U.S. Cl. .................. 526/279; 526/352; 526/227; 526/348.1; 526/348
(58) Field of Classification Search ................. 526/352, 526/227, 279, 348.1, 348
See application file for complete search history.

(56) References Cited

U.S. PATENT DOCUMENTS

| | | | | |
|---|---|---|---|---|
| 4,614,764 A | | 9/1986 | Colombo et al. | |
| 5,169,900 A | * | 12/1992 | Gudelis | ...................... 525/106 |
| 2006/0201544 A1 | | 9/2006 | Inoue | |

FOREIGN PATENT DOCUMENTS

| | | | |
|---|---|---|---|
| JP | 58-60579 | | 4/1983 |
| JP | 58-63178 | | 4/1983 |
| JP | 03207644 | | 9/1991 |
| JP | 04007145 | | 1/1992 |
| JP | 5-186610 | | 7/1993 |
| JP | 2002-9309 | | 1/2002 |
| JP | 2002-009309 | * | 1/2002 |
| JP | 2003-46104 | | 2/2003 |
| JP | 2003-046105 | * | 2/2003 |
| JP | 2003-46105 | | 2/2003 |
| JP | 2003-49004 | | 2/2003 |
| WO | WO 2004/055908 | | 7/2004 |

* cited by examiner

*Primary Examiner*—Ling-Siu Choi
(74) *Attorney, Agent, or Firm*—Ladas & Parry LLP

(57) ABSTRACT

The invention mainly aims to provide an economical filler layer for a solar cell module which is excellent in the adhesion property to a transparent front substrate and a backside protective sheet, does not worsen the working environments, and causes no adverse effect on a solar cell element or electrodes at the time of production. To accomplish the aim, the invention provides a filler layer for a solar cell module containing a silane-modified resin obtained by polymerizing an ethylenic unsaturated silane compound and a polyethylene for polymerization and characterized in that the filler layer for a solar cell module has a gel fraction of 30% or lower when the filler layer for a solar cell module is used in a solar cell module.

11 Claims, 1 Drawing Sheet

FILLER LAYER FOR SOLAR CELL MODULE AND SOLAR CELL MODULE USING SAME

TECHNICAL FIELD

The invention relates to a filler layer for a solar cell module having a silane-modified resin and a solar cell module using the filler layer.

BACKGROUND ART

In recent years, attention has been paid to a solar cell as a clean energy source in light of an upsurge of consciousness of environmental problems. At present, solar cell modules in various forms have been developed and suggested.

Generally the solar cell module is produced by laminating a transparent front substrate, a filler layer, a solar cell element as a photovoltaic device, a filler layer, a backside protective sheet, and the like in this order and then thermally pressure-bonding them by vacuum suction in such as a lamination method.

Today, as material for composing the filler layer for a solar cell module, ethylene-vinyl acetate copolymer resin with a thickness of 100 μm to 1500 μm has most commonly been used in terms of the processibility, layering workability, production cost, and so forth.

However, the filler layer of the ethylene-vinyl acetate copolymer resin is not necessarily sufficient in the adhesion strength to the transparent front substrate or the backside protective sheet and has a problem that the disadvantageous weakness becomes apparent in the long time use in outdoors. Further, in the case of producing a solar cell module using the filler layer of the ethylene-vinyl acetate copolymer resin, the ethylene-vinyl acetate copolymer resin is thermally decomposed and evolves acetic acid gas and the like depending on the conditions of the thermal pressure bonding. These gases not only worsen the working environments but also cause adverse effects on the solar cell element and electrodes to result in deterioration and decrease of electric power generation efficiency.

Therefore, a method of polymerizing a silane compound with the resin is employed as a method for providing the resin, which is a material for the filler layer, with an adhesive property to glass or metals to be used for the transparent front substrate or the backside protective sheet.

Generally, there are two polymerization methods; a copolymerization method and a graft polymerization method. The copolymerization method is a method carried out by mixing monomers, a catalyst, and an unsaturated silane compound and carrying out polymerization reaction at prescribed temperature and pressure. The graft polymerization method is a method carried out by mixing polymers, a free-radical initiator, and an unsaturated silane compound and polymerizing the silane compound to the polymer main chain or side chains in stirring condition at a prescribed temperature.

For example, in order to provide strength, heat resistance and durability to the material itself by causing crosslinking reaction in the resin, which is the material of the filler layer, at the time of thermal pressure bonding, the following methods have been proposed; a method using a resin sheet obtained by adding a silane coupling agent and an organic peroxide to the ethylene-vinyl acetate copolymer resin (Japanese Patent Publication (JP-B; KOKOKU) No. 14111/1987 (i.e., SHO 62-14111)); a method using a resin sheet obtained by adding an organic peroxide to an ethylene-vinyl acetate copolymer resin graft-modified with an organic silane compound (Japanese Patent Publication (JP-B; KOKOKU) No. 9232/1987 (i.e., SHO 62-9232)); and a method using a resin sheet obtained by adding an organic peroxide to a ternary copolymer resin of ethylene-ethylenic unsaturated carboxylic acid ester-ethylenic unsaturated silane compound (Japanese Patent Publication (JP-B; KOKOKU) No. 104729/1994 (i.e., Hei 6-104729)), however since these methods all use the organic peroxide, the organic peroxide is decomposed at the time of sheet formation to induce crosslinking reaction of the resins to make sheet formation difficult or to deteriorate processibility at the time of lamination or the decomposition products derived from the organic peroxide remain in the adhesion interfaces and cause adhesion inhibition at the time of lamination.

There is another problem that the silane compound is expensive and further improvements are still required.

DISCLOSURE OF THE INVENTION

Therefore, the invention mainly aims to provide an economical filler layer for a solar cell module which is excellent in the adhesion property to a transparent front substrate and a backside protective sheet, does not worsen the working environments, and causes no adverse effect on a solar cell element or electrodes at the time of production.

To accomplish the aim, the invention provides a filler layer for a solar cell module containing a silane-modified resin obtained by polymerizing an ethylenic unsaturated silane compound and a polyethylene for polymerization and characterized in that the filler layer for a solar cell module has a gel fraction of 30% or lower when the filler layer for a solar cell module is used in a solar cell module.

Since the above-mentioned filler layer for a solar cell module contains a silane-modified resin, the layer is excellent in the adhesion property to a transparent front substrate and a backside protective sheet, e.g. glass, and since the main chain of the resin is a polyethylene, no harmful gas is evolved and the work environments are not worsened. Further, when the filler layer is used for a solar cell module, adjustment of the gel fraction in the filler layer for a solar cell module in the above-mentioned range makes it possible to carry out sealing within a short time and makes further heating treatment unnecessary. Also owing to a low gel fraction as described, the filler layer can easily be softened and melted by heating and accordingly, recycling of the solar cell element and the transparent front substrate used for the solar cell module is made possible.

In the present invention, the filler layer for a solar cell module preferably further containing a polyethylene. Since the above-mentioned silane-modified resin is costly, it is preferable for the filler layer for a solar cell module to contain a polyethylene for addition.

According to the present invention, the polyethylene for polymerization and the polyethylene for addition are preferably at least one polyethylene selected from a group of a low density polyethylene, a medium density polyethylene, a high density polyethylene, a very low density polyethylene, an ultra low density polyethylene, and a linear low density polyethylene.

Moreover, the amount of the silane-modified resin contained in the filler layer for a solar cell module is preferably in a range of 1 to 80% by weight. The above silane-modified resin contains the ethylenic unsaturated silane compound polymerized with the polyethylene for polymerization, so that the resin is provided with the adhesion property to glass or the like. Accordingly, since the filler layer for a solar cell module contains the above-mentioned silane-modified resin, the layer is provided with a high adhesion property to the transparent front substrate, the backside protective sheet, and the solar cell element. Consequently, if the amount is less than the above-mentioned range, the adhesion property to glass or the like becomes insufficient, and if it exceeds the above-mentioned range, the cost is increased with no preferable change of the adhesion property to glass or the like.

Further, the filler layer for a solar cell module preferably contains Si (silicon) in a form of a polymerized Si at the amount of 8 ppm to 3500 ppm. Similarly to the above-mentioned reasons, it is because controlling of the polymerized Si to be in the range gives good adhesion property to the solar cell element and the transparent front substrate.

In the present invention, the filler layer for a solar cell module preferably contains practically no silanol condensation catalyst. It is because this invention is characterized in that the gel fraction in the filler layer is at a prescribed value or lower. The desired gel fraction can not be obtained if a silanol condensation catalyst commonly used for water crosslinking or the like is added to the resin composition containing the ethylenic unsaturated silane compound.

Furthermore, the present invention provides a solar cell module comprising the above-mentioned filler layer for a solar cell module. The solar cell module having the filler layer for a solar cell module of the invention is provided with the above-mentioned advantageous points of the filler layer e of the invention and is also advantageous in terms of the cost.

The filler layer for a solar cell module is excellent in the adhesion property to glass to be used for the protection sheet for a solar cell module and it does not worsen the working environments. Further, the filler layer makes it possible to carry out sealing within a short time at the time of producing the solar cell module and also makes heating treatment unnecessary. Moreover, recycling of members contained in the solar cell module is made possible.

BEST MODE FOR CARRYING OUT THE INVENTION

Figure 1:
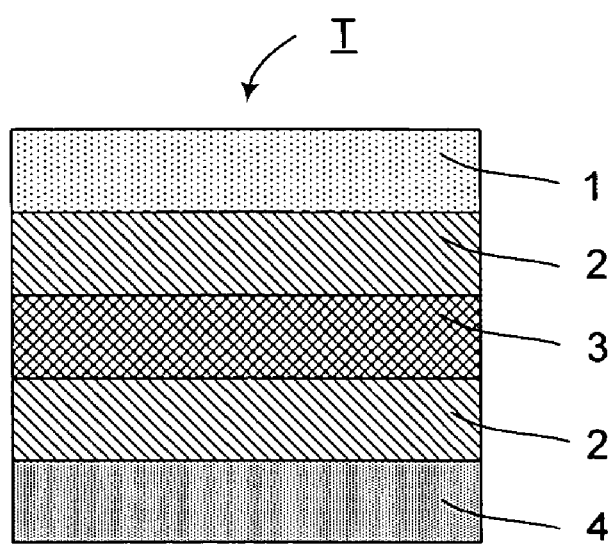
FIG. 1 is a schematic cross-sectional view showing one example of a solar cell module of the invention.

The invention provides a filler layer for a solar cell module and a solar cell module using the same. Hereinafter, the filler layer for a solar cell module and the solar cell module using the layer will be described. In this connection, a sheet means both of a sheet-like article and a film-like article and a film also means both of a film-like article and a sheet-like article.

A. Filler Layer for a Solar Cell Module

First, the filler layer for a solar cell module of the invention will be described. The filler layer for a solar cell module contains a silane-modified resin obtained by polymerizing an ethylenic unsaturated silane compound and polyethylene for polymerization. The filler layer is characterized in that the gel fraction is a prescribed value or lower when the filler layer for a solar cell module is used for the solar cell module.

Hereinafter, the respective components of the filler layer for a solar cell module will be described.

1. Silane-Modified Resin Composition

The silane-modified resin to be used in the invention is a polymer formed by polymerization of an ethylenic unsaturated silane compound and polyethylene for polymerization. Such a silane-modified resin is produced by mixing the ethylenic unsaturated silane compound, polyethylene for polymerization, and a radical initiator, stirring and melting them at a high temperature, and graft polymerizing the ethylenic unsaturated silane compound with the polyethylene for polymerization.

The polyethylene for polymerization to be used in the invention is not particularly limited if it is a polyethylene type polymer. Specifically, a low density polyethylene, a medium density polyethylene, a high density polyethylene, a very low density polyethylene, an ultra low density polyethylene, or a linear low density polyethylene is preferable. One or more of them may be used in combination.

Further, as the polyethylene for polymerization is preferably a polyethylene having many side chains. In this connection, polyethylenes having more side chains have a low density and polyethylenes having less side chains have a high density. Accordingly, polyethylenes with a low density are more preferable. The density of the polyethylene for polymerization in the invention is preferably in a range of 0.850 to 0.960 g/cm$^3$ and more preferably in a range of 0.865 to 0.930 g/cm$^3$. It is because if the polyethylene for polymerization is a polyethylene having many side chains, that is, a low density polyethylene, the ethylenic unsaturated silane compound is easily graft-polymerized with the polyethylene for polymerization.

On the other hand, as for the ethylenic unsaturated silane compound used in the present invention, it is not particularly limited as long as it graft-polymerized with the polyethylene for polymerization. For example, one or more out of the following can be used: vinyltrimethoxysilane, vinyltriethoxysilane, vinyltripropoxysilane, vinyltriisopropoxysilane, vinyltributoxysilane, vinyltripentyloxysilane, vinyltriphenoxysilane, vinyltribenzyloxysilane, vinyltrimethylenedioxysilane, vinyltriethylenedioxysilane, vinypropionyloxysilane, vinyltriacetoxysilane, or vinyltricarboxysilane. Vinyltrimethoxysilane is preferably used in the present invention.

In the invention, the amount of the ethylenic unsaturated silane compound in the filler layer for a solar cell module is preferably 10 ppm or more and further preferably 20 ppm or more. The filler layer for a solar cell module contains the ethylenic unsaturated silane compound polymerized with the polyethylene for polymerization, so that the good adhesion property to a material, e.g. glass, to be employed for the transparent front substrate and the rear sheet for a solar cell module, which will be described later, can be provided. Accordingly, if the amount is less than the above range, the adhesion property to glass becomes insufficient. An upper limit of the amount of the ethylenic unsaturated silane compound is preferably 4000 ppm or less and further preferably 3000 ppm or less. The upper limit is not limited in terms of the adhesion property to glass or the like, if it exceeds the above-mentioned range, the cost is increased although the adhesion property to glass is not changed.

It is preferable for the above-mentioned silane-modified resin to be contained in a range of 1 to 80% by weight in the above-mentioned filler layer for a solar cell module and it is more preferable in a range of 5 to 70% by weight. Also in this case, similarly as described, the silane-modified resin is provided with a adhesion property to glass or the like by existence of the ethylenic unsaturated silane compound polymerized with the polyethylene for polymerization. Accordingly, the filler layer for a solar cell module has a high adhesion property to glass since it contains the silane-modified resin as described above. Consequently, in terms of the adhesion property to glass or the like and the cost, the silane-modified resin is used preferably in the above-mentioned range.

The silane-modified resin has a melt mass flow rate at 190° C. preferably in a range of 0.5 to 10 g/10 minute and more preferably in a range of 1 to 8 g/10 minute. It is because the formability of the filler layer for a solar cell module and the adhesion property and the like to the transparent front substrate and the backside protective sheet are made excellent.

The melting point of the silane-modified resin is preferably 110° C. or lower. At the time of producing a solar cell module using the filler layer for a solar cell module, the above-mentioned range is preferable in terms of the processibility or the like.

Examples of a radical generation agent to be added to the silane-modified resin are organic peroxides, e.g. hydroperoxides such as diisopropylbenzene hydroxyperoxide and 2,5-dimethyl-2,5-di(hydroperoxy)hexane; dialkylperoxides such as di-tert-butyl peroxide, tert-butylcumyl peroxide, dicumyl peroxide, 2,5-dimethyl-2,5-di(tert-butylperoxy)hexane, and 2,5-dimethyl-2,5-di(tert-peroxy)hexyn-3; diacyl peroxides such as bis(3,5,5-trimethylhexanoyl)peroxide, octanoyl peroxide, benzoyl peroxide, o-methylbenzoyl peroxide, and 2,4-dichlorobenzoyl peroxide; peroxy esters such as tert-butylperoxy acetate, tert-butylperoxy-2-ethylhexanoate, tert-butylperoxy pyvalate, tert-butylperoxy octoate, tert-butylperoxyisopropyl carbonate, tert-butylperoxybenzoate, di-tert-butylperoxy phthalate, 2,5-dimethyl-2,5-di(benzoylperoxy)hexane, and 2,5-dimethyl-2,5-di(benzoylperoxy)hexyn-3; and ketone peroxides such as methyl ethyl ketone peroxide and cyclohexanone peroxide; and azo compounds such as azobis(isobutyronitrile) and azobis(2,4-dimethylvaleronitrile).

The used amount of the radical initiator is preferable to be added in an amount of 0.001% by weight or more in the silane-modified resin. This is because if it is less than the above-mentioned range, the radical polymerization of the ethylenic unsaturated silane compound and the polyethylene for polymerization is difficult to be caused.

The silane-modified resin to be used in the invention may be used for laminate glass. The laminate glass is produced by sandwiching a soft and tough resin or the like between glass plates and thermally pressure bonding the plates. Therefore, in terms of the adhesion property to glass, the above-mentioned silane-modified resin can be used.

2. Polyethylene for Addition

In the invention, the filler layer for a solar cell module is preferable to contain the above-mentioned silane-modified resin and a polyethylene for addition. Examples of the polyethylene for addition are those similar to the polyethylenes exemplified in the paragraph "1. Silane-modified resin". In the invention, the polyethylene for addition is particularly preferable to be the same as the above-mentioned polyethylene for polymerization. It is because since the silane-modified resin is costly, rather than the formation of the filler layer for a solar cell module using the silane-modified resin alone, formation of the filler layer for a solar cell module by adding the polyethylene for addition with the silane-modified resin is advantageous in terms of the cost.

The content of the polyethylene for addition is preferably 0.01 part by weight to 9,900 parts by weight and more preferably 90 parts by weight to 9,900 parts by weight to the silane-modified resin 100 parts by weight.

When two or more kinds of the silane-modified resins are used, the content of the polyethylene for addition is preferable to be in the above-mentioned range to the resins 100 parts by weight in total.

The polyethylene for addition is preferable to have a melt mass flow rate at 190° C. in a range of 0.5 to 10 g/10 minute and more preferable to have it in a range of 1 to 8 g/10 minute.

It is because the formability or the like of the filler layer for a solar cell module becomes excellent.

The melting point of the polyethylene for addition is preferable to be 130° C. or lower. This range is preferable in terms of the processibility or the like at the time of producing the solar cell module using the filler layer for a solar cell module.

A melting point measurement method is carried out by differential scanning calorimetry (DSC) according to the measurement method of transition temperature of plastics (JISK 7121). In this connection, when two or more melting points exist, the higher temperature is defined to be the melting point.

3. Additives

In the invention, as needed, additives such as a light stabilizer, an ultraviolet absorbent, a thermal stabilizer, or the like may be used. If the filler layer for a solar cell module of the invention contains the above-mentioned silane-modified resin and additionally contains a light stabilizer, an ultraviolet absorbent, a thermal stabilizer, or the like, the mechanical strength, adhesion strength, prevention of yellowing, prevention of cracking, and excellent suitability for processing can be provided.

The light stabilizer is an agent for catching active species which initiate photo-deterioration in the polymers to be used for the polyethylene for polymerization and the polyethylene for addition and accordingly preventing photooxidation. Specifically, at least one kind of compounds selected from hindered amine type compounds, hindered piperidine type compounds, and others can be used.

The ultraviolet absorbent is an agent for absorbing harmful ultraviolet rays in the sun light and converting the ultraviolet rays into harmless heat energy in the molecules and accordingly preventing excitation of the active species which initiate photo-deterioration in the polymers to be used for the polyethylene for polymerization and the polyethylene for addition. Specifically, at least one kind of inorganic type ultraviolet absorbents selected from a group of consisting of benzophenone type, benzotriazole type, salicylate type, acrylonitrile type, metal complex salt type, hindered amine type ultraviolet absorbents, ultra fine particles of titanium oxide (particle diameter: 0.01 μm to 0.06 μm), and ultra fine particles of zinc oxide (particle diameter: 0.01 μm to 0.04 μm) can be used.

Examples of the thermal stabilizer may include phosphorus type thermal stabilizers such as tris(2,4-di-tert-butylphenyl)phosphite, bis[2,4-bis(1,1-dimethylethyl)-6-methylphenyl]ethyl ester phosphite, tetrakis(2,4-di-tert-butylphenyl)[1,1-biphenyl]-4,4'-diyl bisphosphonite, and bis(2,4-di-tert-butylphenyl)pentaerythritol disphosphite; and lactone type thermal stabilizers such as a reaction product of 8-hydroxy-5,7-di-tert-butyl-furan-2-one and o-xylene. One or more of them may be used in combination. Among them, a phosphorus type thermal stabilizer and a lactone type thermal stabilizer may be used in combination.

The content of the light stabilizer, the ultraviolet absorbent, and the thermal stabilizer is preferably in a range of 0.01 to 5% by weight in the filler layer for a solar cell module, although it differs depending on the particle shape, the density and the like.

In the case of being used for a solar cell module, the filler layer for a solar cell module is characterized in that the gel fraction is low as it is described later and therefore, it is unnecessary to form a crosslinked structure of the silane-modified resin. Accordingly, a catalyst or the like for promoting condensation reaction of a crosslinking agent or silanol groups is not particularly needed.

Specifically, it is preferable that a silanol condensation catalyst e.g. dibutyl tin diacetate, dibutyl tin dilaurate, dibutyl tin dioctanoate, and dioctyl tin dilaurate, for promoting dehydration condensation reaction of silanol groups in silicone, is not practically contained. Here, the catalyst is not practically contained means the case that the content is 0.05 part by weight or less in the resin composition composing the filler layer for a solar cell module 100 parts by weight.

4. Filler Layer for a Solar Cell Module

The thickness of the filler layer for a solar cell module of the invention is preferably in a range of 10 to 2000 μm and especially preferably in a range of 100 to 1250 μm. In the case the thickness is thinner than the above-mentioned range, the layer cannot support a cell to result in easiness of breakage of the cell. When the thickness is thicker than the above-mentioned range, the weight of the module becomes heavy while also worsen the workability at the time of installation, and the cost performance is also disadvantageous.

In the invention, it is preferable that Si (silicon) is contained at a ratio by weight in a range of 8 ppm to 3500 ppm, more preferably in a range of 10 ppm to 3000 ppm, and even more preferably in a range of 50 ppm to 2000 ppm in the filler layer for a solar cell module. It is because when Si is contained in form of polymerized Si at a ration by weight in the above-mentioned range, the adhesion property to the transparent front substrate and the solar cell element can be kept good. Also the above-mentioned range is preferable in term of the cost.

As a method of measuring the weight ratio of the polymerized Si may be employed a method involving steps of burning only the filler layer to be ash by heating and thereby converting the polymerized Si into $SiO_2$, melting the ash in an alkali, dissolving the resulting ash in pure water, adjusting the volume to be constant, and carrying out ICP optical emission spectrometry (high frequency plasma emission spectrometer ICPS 8100, manufactured by Shimadzu Corporation).

As the resin composing the filler layer for a solar cell module, those which have the melt mass flow rate at 190° C. in a range of 0.5 to 10 g/10 minute are preferable and those having it in a range of 1 to 8 g/10 minute are more preferable. It is because the formability of the filler layer for a solar cell module, the adhesion property to the transparent front substrate and the backside protective sheet and other factros are made excellent.

The melting point of the resin composing the filler layer for a solar cell module is preferably 130° C. or lower. The above-mentioned range is preferable in terms of the processibility at the time of producing the solar cell module using the filler layer for a solar cell module. This is also because if the melting point is about the above-mentioned temperature, recycling of parts composing the solar cell module, e.g. solar cell element and the transparent front substrate is made easy when they are re-utilized. The measurement method of the melting point is the same as described above and therefore no further explanation is described here.

In the case the filler layer for a solar cell module of the invention is used for the solar cell module, the gel fraction is preferably 30% or lower, more preferably 10% or lower, and even more preferably 0%. Since the silane-modified resin to be used in the invention does not form a crosslinked structure as described, sealing can be carried out within a short time and post-treatment such as heating treatment is unnecessary. Also, if the gel fraction exceeds the above-mentioned range, the processibility at the time of production of the solar cell module is deteriorated and no improvement of the adhesion property to the transparent front substrate and the backside protective sheet is observed. Further, if the gel fraction exceeds the above-mentioned range, recycling of parts composing the solar cell module, e.g. solar cell element and the transparent front substrate is made difficult.

The gel fraction in the case the filler layer for a solar cell module is used in the solar cell module means the gel fraction of the filler layer for a solar cell module after the solar cell module is produced by a conventional formation method such as a lamination method involving steps of successively laminating a transparent front substrate, a filler layer for a solar cell module, a solar cell element, a filler layer for a solar cell module, and a backside protective sheet in this order and then thermally pressure-bonding the united body by vacuum suction.

As a measurement method of the gel fraction is employed a method involving steps of weighing a sample of the filler layer for a solar cell module 1 g, putting it in a wire-netting bag with 80 meshes, loading the sample together with the bag in a Soxhlet extractor, and refluxing xylene at the boiling point. After the continuous extraction for 10 hours, the sample is taken out together with the bag and dried to weigh. The weights before and after extraction are compared to measure the % by weight of the remaining insoluble matter for using it as the gel fraction.

5. Production Method of Filler Layer for Solar Cell Module

Next, a production method of the filler layer for a solar cell module of the invention will be described.

First, a preparation method of the silane-modified resin to be used in the invention will be described. The silane-modified resin can be obtained by thermally melting and mixing an ethylenic unsaturated silane compound, a polyethylene for polymerization, and a radical initiator and thereby graft polymerizing the ethylenic unsaturated silane compound with the polyethylene for polymerization.

The thermally melting and mixing method of the mixture is not particularly limited. Regarding an additive, however, it is preferable to employ a method carried out by mixing a master batch, which contains a resin previously mixed and kneaded with the additive, with main raw materials and extrusion-melting the mixture. The heating temperature is preferably 300° C. or lower and more preferably 270° C. or lower. The above-mentioned silane-modified resin is easy to be crosslinked and gelled in the silanol group portions by heating, so that the melting and mixing is preferable to be carried out in the above-mentioned range.

Next, a formation method of the filler layer for a solar cell module of the invention will be described. As described above, it may be possible that after the silane-modified resin is thermally melted and mixed, the obtained silane-modified resin is formed into pellets and again thermally melted and mixed and extruded. It may also be possible to feeding the silane-modified resin and the polyethylene for addition to a hopper of an extruder and thermally melting the mixture in the cylinder. The latter is excellent in terms of the cost.

After the resin is heated and melted as described above, the melt is formed to be like a sheet with a thickness of 100 to 1500 μm by a conventional method such as a T-die or inflation molding and form the filler layer for a solar cell module.

The heating temperature at the time of thermally melting again is preferably 300° C. or lower and more preferably 270° C. or lower. As described, the silane-modified resin is easy to be crosslinked and gelled in the silanol group portions by heating, so that it is preferable for the resin to be melted by heating in the above range of temperature and then extruded.

B. Solar Cell Module

Next, a solar cell module of the invention will be described. The solar cell module of the invention is characterized in that the module has the above-mentioned filler layer for a solar cell module. FIG. 1 is a schematic cross-sectional view of a solar cell module produced using the filler layer for a solar cell module. As shown in FIG. 1, the solar cell module T is produced by a common formation method such as a lamination method carried out by laminating a transparent front substrate 1, a filler layer for a solar cell module 2, a solar cell element 3 as a photovoltaic device, a filler layer for a solar cell module 2, and a backside protective sheet 4 in this order and then thermally pressure-bonding them to be a united body by vacuum suction.

In the invention, the lamination temperature when such a lamination method is employed is preferably in a range of 90° C. to 230° C. and more preferably in a range of 110° C. to 190° C. If the temperature is lower than the above-mentioned range, melting becomes insufficient and the adhesion property to the transparent front substrate, an auxiliary electrode, the solar cell element, the backside protective sheet tends, and the like to be deteriorated. If it is higher than the above range, water crosslinking owing to moisture in the atmospheric air tends to be promoted and the gel fraction tends to become high, thus, it is not preferable. The lamination time is preferably in a range of 5 to 60 minutes and more preferably in a range of 8 to 40 minutes. If the time is shorter than the above-mentioned range, melting becomes insufficient and the adhesion property to the members tends to be deteriorated. If it is longer, it becomes a problem in terms of the production process and particularly in accordance with the temperature ad the humidity conditions and it may possibly result in increase of the gel fraction. With respect to the humidity, if it is too high, the gel fraction is increased and if it is too low, the adhesion property to various members may possibly be decreased, however if it is in a normal humidity level under common atmospheric environments, no particular problem is caused.

In the invention, the filler layer for a solar cell module may be formed between the transparent front substrate and the solar cell element or may be formed between the transparent front substrate and the solar cell element and between the backside protective sheet and the solar cell element.

Further, in the solar cell module of the invention, other layers may optionally be laminated for a purpose of the sun light absorption, reinforcement, and other purposes.

As the transparent front substrate to be employed for the solar cell module of the invention, glass, a fluorine resin sheet, and a transparent composite sheet obtained by laminating a weathering resistant film and a barrier film may be used.

As the backside protective sheet to be employed for the solar cell module of the invention, a metal such as aluminum, a fluorine resin sheet, and a composite sheet obtained by laminating a weathering resistant film and a barrier film may be used.

C. Recycling of Solar Cell Module

As described above, in the invention, since the gel fraction of the filler layer in the solar cell module is adjusted to be a prescribed range, members of the used solar cell module and defective solar cell modules outputted during the production process, more specifically the solar cell element and the transparent front substrate can be re-utilized. Hereinafter, with respect to the recycling, a production method of a recovered solar cell, a production method of a recycled transparent front substrate, and a production method of a recovered solar cell module will be described separately.

(1) Production Method of Recovered Solar Cell

First, a production method of recovered solar cell will be described. The production method of recovered solar cell is a recovered solar cell production method for obtaining a recovered solar cell from the above-mentioned solar cell module of the invention and involves processes of: heating process wherein the solar cell module is heated at a temperature equal to or higher than the melting point of the resin composing the filler layer, separation process wherein the solar cell element is separated from the filler layer plasticized by heating, and removing process wherein the filler layer adhering to the solar cell element is removed. Hereinafter, the respective processes will be described.

1. Heating Process

In the heating process, the solar cell module is heated at a temperature equal to or higher than the melting point of the resin composing the filler layer. Heating the solar cell module at a temperature equal to or higher than the melting point of the resin composing the filler layer as described makes it possible to soften and melt the resin composing the filler layer and accordingly easily remove the filler layer.

The heating method may be a method of feeding the solar cell module of the invention into a container filled with a heated gas, liquid, a solid such as a powder, or combinations thereof or a method of holding the solar cell module on a heated hot plate.

Heating temperature is a temperature equal to or higher than the melting point of the resin composing the filler layer and properly selected according to the employed resin. The softening point means Vicat softening temperature measured according to JIS K7206 standard of the above-mentioned thermoplastic resin. The heating temperature in the heating process is equal to the Vicat softening temperature or higher than that preferably by 0° C. to 250° C., more preferably by 10° C. to 150° C., or even more preferably by 20° C. to 130° C.

Specific heating temperature in the heating process is preferably in a range of 20° C. to 450° C., more preferably 30° C. to 350° C., and even more preferably 110° C. to 170° C.

2. Separation Process

The separation process in the invention is a process of separating the solar cell element by utilizing the softening and melting of the filler layer by heating in the heating process. The separation process may be carried out by any separation method if it can separate the solar cell element without damaging the element.

As the separation method, a method of using separation means or a method of applying shearing stress may be employed.

The method of using separation means is a method of separating the transparent front substrate and the backside protective sheet from the solar cell element by passing the cutting means through the filler layer formed between the transparent front substrate and the solar cell element and the filler layer formed between the solar cell element and the backside protective sheet of the solar cell module heated in the heating process. Such separation means is not particularly limited if it can cut the softened filler layer and a wire can be exemplified as a preferable means.

The method of applying shearing stress is a method of separating the transparent front substrate and the backside protective sheet from the solar cell element by applying shearing stress to the filler layer while pushing at least one of the solar cell element and the transparent front substrate or at least one of the solar cell element and the backside protective sheet of the solar cell module heated in the heating process in a lateral direction.

3. Removing Process

In the removing process in the invention, the filler layer adhering to the solar cell element after separation is removed. As the removal method, physical washing of physically removing the filler layer, chemical washing of chemically removing the filler layer, or combination thereof may be exemplified.

The physical washing includes such as a method of blowing a gas, a liquid, a solid, or combinations thereof or a method of wiping with a cloth. The physical washing is preferable to be carried out in the state that the filler layer is heated. For example, an air blast method and a shot blast method of jetting compressed air and steel ball shots at a high speed by using compressed air or centrifugation in heating atmosphere can be exemplified. The physical washing is advantageous when the adhering substances are in the portion existing in the filler layer.

In the physical washing, it is required to remove the adhering substance without damaging the solar cell element to be re-utilized. Therefore, for instance, when the filler layer is removed by blowing fine particles, the particle diameter of the fine particles is preferably in a range of 5 μm to 500 μm. As a solid usable for the physical washing, a steel type grinding material, a stainless steel grinding material, a zinc grinding material, a copper grinding material, an alumina grinding material, a silicon carbide grinding material, glass grinding material, a resin grinding material, silica sand, ceramic beads, zirconia, slag, calcium carbonate, sodium bicarbonate, and the like may be employed.

As a liquid, a heated organic solvent and a metal liquid may be employed.

As a gas, an inert gas such as air, nitrogen gas, argon gas, and helium gas may be employed.

Specifically, a method for removing the separated layer from the solar cell element by immersing the separated solar cell element in an organic solvent such as xylene and refluxing xylene or other method can be exemplified.

As the chemical washing, an acid or alkali treatment method and a method for dissolution in a solvent can be exemplified. The solvent to be used for the chemical washing can properly be selected depending on the adhering filler layer.

As the method of combining the physical washing and chemical washing, a method for completely removing the adhering substance by air blast or shot blast after immersion in a liquid capable of dissolving the adhering substance for a certain period can be exemplified.

The adhering substance can be removed in the above-mentioned manner and if necessary, washing with alcohol or the like is carried out further to easily produce the recovered solar cell from the used solar cell module.

(2) Production Method of Recovered Transparent Front Substrate

Next, a production method of a recovered transparent front substrate will be described. The production method of the recovered transparent front substrate is a recovered transparent front substrate production method for obtaining the recovered transparent front substrate from the solar cell module of the invention above-mentioned and involves processes of: heating process wherein the solar cell module is heated at a temperature equal to or higher than the melting point of the resin composing the filler layer and having the gel fraction at a prescribed value or lower, separation process wherein the filler layer plasticized by heating is parted in order to separate the recovered transparent front substrate, and removing process wherein the filler layer adhering to the transparent front substrate is removed. Hereinafter, the respective processes will be described.

1. Heating Process

In the heating process, the transparent front substrate can easily be separated from the filler layer by heating the solar cell module at a temperature equal to or higher than the softening point of the resin composing the filler layer. The heating method and the heating temperature are the same as described in the paragraph: (1) Production method of recovered solar cell. Thus, no further explanation is described here.

2. Separation Process

In the separation process, the transparent front substrate is parted and separated from the filler layer softened and melted by heating in the heating process. The separation method is not particularly limited unless the method damages the transparent front substrate.

Specific examples may include the separating means described in the paragraph: (B) Production method of recovered solar cell, and the method of applying shearing stress.

3. Removing Process

In the removing process, the filler layer adhering to the transparent front substrate is removed. The removing method can be carried out by physical washing, chemical washing or their combination similarly to the method described in the paragraph:

(1) Production method of recovered solar cell. Details are same as described and therefore no further explanation is described here.

After the removal of the filler layer, if necessary, washing with an alcohol or the like is carried out to easily produce a recovered transparent front substrate from the used solar cell module.

(3) Recycling Method of Solar Cell Module

Finally, a recycling method of the solar cell module will be described. The recycling method of the solar cell module is a solar cell module recycling method for recycling members from the solar cell module described in the paragraph: B. Solar cell module, and involves processes of: heating process wherein the solar cell module is heated at a temperature equal to or higher than the melting point of the resin composing the filler layer, separation process wherein the solar cell element is separated by parting the member from the filler layer plasticized by heating.

The solar cell module recycling method makes it possible to recycle (recycle or reuse) of members such as a solar cell element contained in a solar cell module, which is determined to be a defective product at the time of solar cell module processing, or members such as a solar cell element contained in a collected used solar cell module. The method is not only advantageous in terms of the cost but also preferable in consideration of the global environmental preservation.

The solar cell module to be subjected to the solar cell module recycling method may include, as described above, a solar cell module, which is determined to be a defective product at the time of solar cell module processing and a solar cell module which is used and collected.

In the invention, such solar cell modules are to be subjected to the heating process and separation process. The heating process and separation process are the same as those described in paragraphs: (1) Production method of recovered solar cell and (2) Production method of recovered transparent front substrate. Thus, no further explanation is described here.

In addition, in the recycling method of the solar cell module, it is preferable to carry out process of separating backside protective sheet simultaneously in the separation process.

For example, when a material such as a fluorine resin which evolves a harmful gas by heating is used for the backside protective sheet, separation of the backside protective sheet from the solar cell module in the process of separating backside protective sheet makes it possible to prevent harmful gas evolution attributed to heating of the backside protective sheet at the time of recycling of the solar cell module. Thus, the load on ambient environments can be lessened.

Separation of the backside protective sheet can be carried out simultaneously with the above-mentioned separation of the solar cell element or the transparent front substrate or before separation of these members.

The treatment after the separation process differs depending on whether the members are used as they are (reuse) or whether the members are used as materials (recycle). In the case of reuse, if the members are the solar cell element and the transparent front substrate, they are reused by the treatment methods described in the paragraphs: (1) Production method of recovered solar cell and (2) Production method of recovered transparent front substrate. On the other hand, in the case of recycle, the members are recycled according to the recycling method described below.

Whether members are reused or recycled may be determined on a case-by-case basis: it is determined in the solar cell module state such as when the solar cell element is apparently broken, and it is determined depending on the conditions of the members such as the solar cell element, the transparent front substrate, and the like composing the solar cell module after separation process.

(Recycle Method)

In the re-utilization method of the solar cell module, recycle methods of the solar cell element and the transparent front substrate among the members of the solar cell module will be described.

1. Solar Cell Element

In the case such as when the element is damaged after the separation process, the above-mentioned removing process is not carried out or after the process is carried out, the element is recycled for purposes to be used other than the solar cell element.

Specifically, the element is melted again for recovering a Si ingot or when a large quantity of an impurity exists in Si, it is used for other purposes.

2. Transparent Front Substrate

Also in this case, after the separation process, no above-mentioned removing process is carried out or the removing process is carried out and then the transparent front substrate is used for other purposes. Specifically, it is recovered in form of glass raw material (cullet) and melted and formed into plate glass.

While the invention has been described with reference to specific embodiments, the description is illustrative of the invention and is not to be construed as limiting the invention.

It is therefore intended that the technical scope of the invention encompass any modifications which comprise the construction substantially equal to the technical idea as defined by the appended claims and have the same effect.

EXAMPLES

Hereinafter, the invention will be described further in detail with reference to examples.

Example 1

(1) Preparation of Silane-modified Resin

A linear low density polyethylene (referred to as LLDPE in Tables) having a density of 0.898 g/cm$^3$ and a melt mass flow rate (referred to as MFR in Tables) at 190° C. of 2 g/10 min 98 parts by weight was mixed with vinyltrimethoxysilane 2 parts by weight and as a radical initiator, dicumyl peroxide 0.1 part by weight and heated, melted, and stirred at 200° C. to obtain a silane-modified resin.

(2) Formation of Filler Layer for Solar Cell Module

The above-mentioned silane-modified resin 5 parts by weight, a linear low density polyethylene having a density of 0.898 g/cm$^3$ 95 parts by weight, and a separately produced a master batch containing a light resistant agent, UVA, and an antioxidant (obtained by mixing a hindered amine type light stabilizer 2.5 parts by weight, a benzophenone type ultraviolet absorbent 7.5 parts by weight, and a phosphorus type thermal stabilizer 5 parts by weight were mixed with a linear low density polyethylene 85 parts by weight and the mixture was melted and processed to be pellets) 5 parts by weight were mixed and led to a hopper of a film forming apparatus having a φ25 mm extruder and a T die with 300 mm width and formed into a 400 μm-thick sheet at drawing speed of 3 m/min and 230° C. extrusion temperature. The film formation could be carried out without any problem. A filler layer for a solar cell module was obtained through the series of the processes.

(3) Production of Solar Cell Module

Using the filler layer for a solar cell module with a thickness of 400 μm produced in (2), a glass plate with a thickness of 3 mm, the filler layer for a solar cell module with a thickness of 400 μm, a crystal silicon solar cell element, the filler layer for a solar cell module with a thickness of 400 μm mentioned above, and a laminated sheet composed of a 38 μm-thick polyfluorovinyl type resin sheet (PVF), a 30 μm-thick aluminum foil, and a 38 μm-thick polyfluorovinyl type resin sheet (PVF) were laminated through acrylic resin type adhesive layers and while the solar cell element was set upward, the laminated body was thermally pressure-bonded at 150° C. for 15 minutes by a vacuum laminator for solar cell module production to obtain a solar cell module.

Examples 2 to 11

(1) Preparation of Silane-modified Resin silane-modified resins were produced in the same manner as Example 1 with polyethylene for polymerization, the ethylenic silane compounds, and the radical initiators shown in Table 1 at the respective mixing ratios.

TABLE 1

|  | polyethylene for polymerization | | ethylenic unsaturated silane compound | radical initiator | mixing ratio |
|---|---|---|---|---|---|
|  | type | density [g/cm³] | MFR [g/10 minutes] | | | |
| Example 1 | LLDPE | 0.898 | 3.5 | vinyltrimethoxysilane | dicumyl peroxide | 98:2:0.10 |
| Example 2 | LLDPE | 0.918 | 4.0 | vinyltrimethoxysilane | t-butylperoxy-2-ethyl hexanoate | 98:2:0.20 |
| Example 3 | LLDPE | 0.880 | 2.2 | vinyltripropoxysilane | dicumyl peroxide | 97:3:0.15 |
| Example 4 | LLDPE | 0.906 | 11 | vinyltrimethoxysilane | dicumyl peroxide | 98:2:0.15 |
| Example 5 | LLDPE | 0.935 | 3.5 | vinyltrimethoxysilane | dicumyl peroxide | 97:3:0.15 |
| Example 6 | | | | Same as Example 1 | | |
| Example 7 | | | | Same as Example 1 | | |
| Example 8 | | | | Same as Example 1 | | |
| Example 9 | | | | Same as Example 1 | | |
| Example 10 | | | | Same as Example 1 | | |
| Example 11 | | | | Same as Example 1 | | |
| Comparative Example 1 | | | | — | | |
| Comparative Example 2 | | | | Same as Example 1 | | |
| Comparative Example 3 | | | | Same as Example 1 | | |
| Comparative Example 4 | | | | Same as Example 1 | | |

(2) Formation of Filler Layer for a Solar Cell Module

The filler layers for a solar cell module were obtained in the same manner as Example 1 in the conditions shown in Table 2. In Table, VLDPE represents a very low density polyethylene and LDPE represents a low density polyethylene.

TABLE 2

|  | polyethylene for addition | | | mixing ratio | | | | extrusion temperature [° C.] |
|---|---|---|---|---|---|---|---|---|
|  | type | density [g/cm³] | MFR [g/10 minutes] | silane-modified resin | polyethylene for addition | master batch | crosslinking agent | |
| Example 1 | LLDPE | 0.898 | 3.5 | 5 | 95 | 5 | — | 230 |
| Example 2 | LLDPE | 0.918 | 4.0 | 2 | 98 | 5 | — | 230 |
| Example 3 | LLDPE | 0.880 | 2.2 | 10 | 90 | 5 | — | 230 |
| Example 4 | LLDPE | 0.906 | 11 | 10 | 90 | 5 | — | 230 |
| Example 5 | LLDPE | 0.935 | 3.5 | 10 | 90 | 5 | — | 230 |
| Example 6 | VLDPE | 0.884 | 1.0 | 10 | 90 | 5 | — | 240 |
| Example 7 | LDPE | 0.917 | 7.2 | 20 | 80 | 5 | — | 230 |
| Example 8 | LLDPE | 0.898 | 3.5 | 40 | 60 | 5 | — | 230 |
| Example 9 | LLDPE | 0.898 | 3.5 | 40 | 60 | 5 | — | 230 |
| Example 10 | | — | | 100 | 0 | 5 | — | 230 |
| Example 11 | | — | | 100 | 0 | 5 | — | 230 |
| Comparative Example 1 | LLDPE | 0.898 | 3.5 | — | 100 | 5 | — | 230 |
| Comparative Example 2 | LLDPE | 0.898 | 3.5 | 5 | 100 | — | — | 230 |
| Comparative Example 3 | LLDPE | 0.898 | 3.5 | 20 | 80 | 5 | 5 | 230 |
| Comparative Example 4 | | — | | 100 | 0 | 5 | 5 | 230 |

(3) Production for Solar Cell Module

The solar cell modules were obtained in Examples 2 to 8 in the same manner as Example 1. The solar cell modules were obtained in Examples 9 and 10 in the same manner as Example 1, except that heat pressure bonding was carried out at 170° C. for 15 minutes by the vacuum laminator. Further, the solar cell module was obtained in Example 11 in the same manner as Example 1, except that heat pressure bonding was carried out at 170° C. for 30 minutes.

Comparative Example 1

Production was carried out in the same manner as Example 1, except that no silane-modified resin was used.

Comparative Example 2

Production was carried out in the same manner as Example 1, except that no master batch was used.

Comparative Examples 3 and 4

Under conditions shown in Table 2, the solar cell modules were obtained as in Example 1, except that the filler layers for a solar cell module were formed in the same manner as Example 1. A master batch 5 parts by weight which contains dibutyltin dilaurate 1 part by weight was used as the crosslinking agent and added by mixing with the silane-modified resin, LLDPE, a master batch containing the light resistant agent, UVA, and the antioxidant and forming a film in the same manner as Example 1.

[Evaluation]

The filler layers for a solar cell module obtained in Examples 1 to 11 and Comparative Examples 1 to 4 were subjected to total light transmittance measurement: the glass adhesion property, gel fraction, and filler removal state in the filler layers for a solar cell module were observed after solar cell module production: and the electromotive force decrease ratio of the solar cell modules was measured in the following conditions. The evaluation results are shown in Table 3.

(Total Light Transmittance)

The total light transmittance was measured for each filler layer for a solar cell module by using a color computer. Specifically, a sheet of the filler layer for a solar cell module was sandwiched between a front and a rear ethylene-tetrafluoroethylene copolymer films (trade name: AFLEX 100 N, manufactured by ASAHI GLASS CO., LTS.) and pressure-bonded at 150° C. for 15 minutes by a vacuum laminator for production of a solar cell module. Then the ethylene-tetrafluoroethylene copolymer films were separated and only the heated sheet of the filler layer for a solar cell module was subjected to measurement.

The solar cell module was kept still in high temperature and high humidity conditions of 85° C. and 85% humidity for 1000 hours. Then the separation strength from glass, which was the transparent front substrate, and the filler layer for a solar cell module was measured.

(Gel Fraction)

The measurement was carried out by the method described in the paragraph: A. Filler layer for a solar cell module.

(Filler Removal State)

Each solar cell module was produced and then the solar cell element and the backside protective sheet were separated from the transparent front substrate (a glass plate) by using a wire in a silicone oil heated at 180° C. after the module was cooled. Thereafter, the silicone oil was removed by washing and the transparent front substrate (the glass plate) bearing remaining filler layer was put on a hot plate kept at 180° C. and the remaining filler layer was wiped out with a cloth. The easiness of the wiping at that time and the remaining state after the wiping were evaluated.

(Electromotive Force Decrease Ratio)

The environmental test of each solar cell module was carried out according to JIS C 8917-1989 standard and output of the photoelectromotive force was measured before and after the test.

TABLE 3

| | total light transmittance [%] | glass adhesion property | gel fraction [%] | filler removal state | electromotive force decrease ratio [%] |
|---|---|---|---|---|---|
| Example 1 | 88 | good | 0 | easily removable | <5 |
| Example 2 | 86 | good | 0 | easily removable | <5 |
| Example 3 | 89 | good | 0 | easily removable | <5 |
| Example 4 | 86 | good | 0 | easily removable | <5 |
| Example 5 | 85 | good | 0 | easily removable | <5 |
| Example 6 | 85 | good | 0 | easily removable | <5 |
| Example 7 | 74 | good | 0 | easily removable | <5 |
| Example 8 | 89 | good | 0.7 | easily removable | <5 |
| Example 9 | 89 | good | 9.6 | easily removable | <5 |
| Example 10 | 88 | good | 16.1 | easily removable | <5 |
| Example 11 | 90 | good | 28.2 | easily removable | <5 |
| Comparative Example 1 | 88 | no adhesion | 0 | easily removable | — |
| Comparative Example 2 | 88 | good | 0 | easily removable | 10 |
| Comparative Example 3 | 90 | good | 32 | partially impossible to remove | <5 |
| Comparative Example 4 | 91 | good | 44 | no removal | <5 |

As sown in Table 3, the filler layers for a solar cell module of examples were excellent in the appearance and the total light transmittance. With respect to the separation strength from glass, even after kept in high temperature and high humidity conditions of 85° C. and 85% humidity for 1000 hours, the solar cell modules of examples showed no change in appearance and the filler layers for a solar cell module were not easily separated and were found in good condition. Further, the solar cell modules of examples were found excellent in the electromotive force decrease ratio. On the other hand, the filler layer for a solar cell module of Comparative Example 1 did not adhere to glass since no silane-modified resin was used and could not evaluate for the electromotive force decrease ratio. The filler layer for a solar cell module of Comparative Example 2 was observed turning yellowish after kept in high temperature and high humidity conditions of 85° C. and 85% humidity for 1000 hours since no master batch was used.

The invention claimed is:

1. A filler layer for a solar cell module containing a silane-modified resin obtained by polymerizing an ethylenic unsaturated silane compound and a polyethylene for polymerization, wherein the filler layer for a solar cell module has a gel fraction of 30% or lower after production of a solar cell module when the filler layer is used in the solar cell module, and further wherein practically no silanol condensation catalyst is contained in the filler layer.

2. The filler layer for a solar cell module according to claim 1, further containing a polyethylene for addition.

3. The filler layer for a solar cell module according to claim 1, wherein the polyethylene for polymerization is at least one polyethylene selected from a group of a low density polyethylene, a medium density polyethylene, a high density polyethylene, a very low density polyethylene, an ultra low density polyethylene, and a linear low density polyethylene.

4. The filler layer for a solar cell module according to claim 2, wherein the polyethylene for polymerization and the polyethylene for addition are at least one polyethylene selected from a group of a low density polyethylene, a medium density polyethylene, a high density polyethylene, a very low density polyethylene, an ultra low density polyethylene, and a linear low density polyethylene.

5. The filler layer for a solar cell module according to claim 1, wherein an amount of the silane-modified resin contained therein is in a range of 1 to 80% by weight.

6. The filler layer for a solar cell module according to claim 2, wherein an amount of the silane-modified resin contained therein is in a range of 1 to 80% by weight.

7. The filler layer for a solar cell module according to claim 1, wherein Si (silicon) is contained in a form of a polymerized Si at the amount of 8 ppm to 3500 ppm.

8. The filler layer for a solar cell module according to claim 2, wherein Si (silicon) is contained in a form of a polymerized Si at the amount of 8 ppm to 3500 ppm.

9. The filler layer for a solar cell module according to claim 1, wherein an amount of the silanol condensation catalyst contained is 0.05 parts by weight or less in the resin composing the filler layer for a solar cell module of 100 parts by weight.

10. The filler layer for a solar cell module according to claim 2, wherein an amount of the silanol condensation catalyst contained is 0.05 parts by weight or less in the resin composing the filler layer for a solar cell module of 100 parts by weight.

11. A solar cell module comprising the filler layer for a solar cell module according to claim 1.

* * * * *